United States Patent
Yoshida et al.

(10) Patent No.: US 6,962,753 B1
(45) Date of Patent: Nov. 8, 2005

(54) HIGHLY HEAT-CONDUCTIVE COMPOSITE MAGNETIC MATERIAL

(75) Inventors: Shigeyoshi Yoshida, Abiko (JP); Mitsuharu Sato, Yokohama (JP); Norihiko Ono, Yokohama (JP)

(73) Assignee: NEC Tokin Corporation, Miyagi (JP)

( * ) Notice: Subject to any disclaimer, the term of this patent is extended or adjusted under 35 U.S.C. 154(b) by 0 days.

(21) Appl. No.: 09/074,012

(22) PCT Filed: Sep. 9, 1997

(86) PCT No.: PCT/JP97/03175

§ 371 (c)(1),
(2), (4) Date: May 5, 1998

(87) PCT Pub. No.: WO98/00632

PCT Pub. Date: Dec. 3, 1998

(30) Foreign Application Priority Data

Sep. 9, 1996 (JP) .............................. 8-237724
Sep. 12, 1996 (JP) .............................. 8-265438

(51) Int. Cl.$^7$ ................................................ B32B 9/00
(52) U.S. Cl. ...................... 428/469; 427/96; 427/126.1; 427/126.3; 427/126.4; 427/126.6; 427/128; 427/131; 427/132; 427/209; 427/404; 427/407.1; 427/419.2; 427/419.3; 427/419.7; 428/457; 428/692; 428/693; 428/698; 428/704; 428/900; 428/928
(58) Field of Search .................. 427/96, 126.1, 427/126.3, 126.4, 126.6, 128, 131, 132, 209, 404, 407.1, 419.2, 419.3, 419.7; 428/457, 469, 692, 693, 698, 704, 900, 928

(56) References Cited

U.S. PATENT DOCUMENTS 4,543,208 A * 9/1985 Horie et al.
4,548,862 A * 10/1985 Hartman
4,857,388 A * 8/1989 Ogawa et al.
5,073,406 A * 12/1991 Takahashi et al.
5,188,907 A * 2/1993 Kawahara et al.
5,512,363 A * 4/1996 Goto et al. .................. 428/323
5,861,088 A * 1/1999 Curtins .................. 174/35 MS

FOREIGN PATENT DOCUMENTS

| EP | 0090432 | 10/1983 |
|---|---|---|
| EP | 0550373 | 7/1988 |
| EP | 0398672 | 11/1990 |
| EP | 0667643 | 8/1995 |
| JP | 59-132196 | 7/1964 |
| JP | 02-010800 | 1/1990 |
| JP | 03-126765 | 5/1991 |
| JP | 04-188861 | 7/1992 |
| JP | 04-2066658 | 7/1992 |
| JP | 05-6851 U | 1/1993 |
| JP | 05-31294 U | 4/1993 |
| JP | 06-9195 U | 2/1994 |
| JP | 06-252282 | 9/1994 |
| JP | 07-045758 | 2/1995 |
| JP | 07-22600 U | 4/1995 |
| JP | 07-122824 | 5/1995 |

(Continued)

*Primary Examiner*—Bernard Pianalto
(74) *Attorney, Agent, or Firm*—Bradley N. Ruben

(57) ABSTRACT

In a composite magnetic body comprising soft magnetic powder dispersed in an organic binding agent and having an electromagnetic interference suppressing effect, powder excellent in thermal conductivity is further dispersed into the organic binding agent so as to provide a composite magnetic body excellent in thermal conductivity. This composite magnetic body may also be used as a heat dissipation sheet for an electronic device. Further, it may also constitute a heat sink having an electromagnetic interference suppressing effect. As the organic binding agent, thermoplastic polyimide or liquid crystal polymer can be cited. As the powder excellent in thermal conductivity, $Al_2O_3$, AlN, cubic BN, insulating SiC or a heat conductive reinforcement (capton) can be cited.

12 Claims, 6 Drawing Sheets

FOREIGN PATENT DOCUMENTS

| | | |
|---|---|---|
| JP | 07-153877 | 6/1995 |
| JP | 07-212079 | 8/1995 |
| JP | 07-335793 | 12/1995 |
| JP | 08-056092 | 2/1996 |
| JP | 08-143998 | 6/1996 |
| JP | 08-204069 | 8/1996 |
| JP | 09-051190 | 2/1997 |

* cited by examiner (a)

(b)

(a)

(b)

(c)

HIGHLY HEAT-CONDUCTIVE COMPOSITE MAGNETIC MATERIAL

TECHNICAL FIELD

The present invention relates to a composite magnetic body comprising soft magnetic powder mixed with an organic binding agent and, in particular, to a composite magnetic body which is excellent in thermal conductivity.

BACKGROUND ART

An electromagnetic interference suppressing body is used for suppressing electromagnetic interference caused by interference of undesired electromagnetic waves.

Conventionally, for blocking invasion of the external undesired electromagnetic waves into an electronic device, shielding of the electronic device by a conductor has been carried out. However, since the blocking of the electromagnetic waves by the conductor aims to reflect the electromagnetic waves, radiant waves from a certain component within the electronic device may be reflected to adversely affect other components in the same electronic device as secondary noise. Particularly, following reduction in size and use of the higher frequency of electronic devices in recent years, problems of the interference due to the external electromagnetic waves and of the secondary noise due to the internal electromagnetic waves are serious.

JP-A-7-212079 discloses a composite magnetic body which can suppress interference of undesired electromagnetic waves utilizing absorption of high-frequency waves due to a complex permeability of a soft magnetic body of a certain kind. This composite magnetic body is constituted of a composite magnetic sheet comprising soft magnetic powder mixed with an organic binding agent.

The sheet of the composite magnetic body may be used as it is. On the other hand, by forming a structure stacked with a conductive sheet, the coming electromagnetic waves are absorbed by the composite magnetic sheet and the electromagnetic waves passing through the composite magnetic sheet are reflected by the conductive sheet into the composite magnetic sheet, so as to suppress the interference of the undesired electromagnetic waves.

Such an electromagnetic interference suppressing body is disposed, for example, on the surface of an electronic device or around an electronic component in the electronic device which is liable to suffer an influence of the external electromagnetic waves. Alternatively, it is used so as to be disposed between two printed circuit boards each mounted thereon with electronic components and confronting each other with a space therebetween.

Incidentally, there is a problem that since the organic binding agent used in formation of the composite magnetic body is liable to be influenced by heat to cause deformation, degradation or the like, it can not be used in contact with an electronic component which generates much heat.

Further, there is a problem that since the organic binding agent is poor in thermal conductivity, it prevents heat dissipation from an electronic component having a large calorific value.

Therefore, an object of the present invention is to provide a composite magnetic body having a high thermal conductivity and being hardly influenced by heat, and an electromagnetic interference suppressing body using the composite magnetic body.

Another object of the present invention is to provide a heat dissipation sheet and a heat sink each using a composite magnetic body having a high thermal conductivity.

DISCLOSURE OF THE INVENTION

As disclosed and claimed herein, the present invention provides a composite magnetic body comprising soft magnetic powder dispersed in an organic binding agent which is characterized in that heat conductive powder is further dispersed into the organic binding agent, thereby the composite magnetic body having a high thermal conductivity.

As preferable one of the heat conductive powder, at least one kind of powder selected from the group of alumina ($Al_2O_3$) powder, aluminum nitride (AlN) powder, cubic boron nitride (BN) powder, insulating silicon carbide (SiC) powder and a heat conductive reinforcement (capton) powder, as recited in the claims, can be cited.

As the organic binding agent, thermoplastic resin having a glass transition temperature of not less than 120° C. is preferable, and typically, thermoplastic polyimide or liquid crystal polymer can be as disclosed and claimed herein.

As recited in claim 5, such a high thermal conductivity composite magnetic body may be stacked with a conductive support to be used as an electromagnetic interference suppressing body.

Further, such a high thermal conductivity composite magnetic body can also be use as a dissipation sheet for an electronic device as claimed herein, or can constitute a heat sink working also for electromagnetic interference suppression.

Further, according to the present invention, as a heat-resistive composite magnetic body can be provided.

BEST MODE FOR CARRYING OUT THE INVENTION

Figure 1:
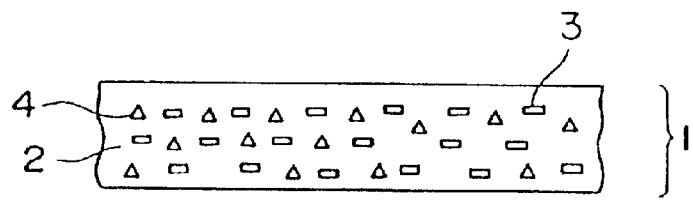
FIG. 1 is a schematic sectional view showing an embodiment of a composite magnetic body of the present invention.

Referring to FIG. 1, in a composite magnetic body 1 according to the present invention, flat (or needle-shaped) soft magnetic powder 3 for absorbing electromagnetic waves is dispersed in an organic binding agent 2, and heat conductive powder 4 is also dispersed therein.

As the organic binding agent 2, thermoplastic resin, such as polyethylene resin, polyester resin, polystyrene resin, polyvinyl chloride resin, polyvinyl butyral resin, polyurethane resin, cellulose resin or nitrile-butadiene rubber, a copolymer thereof, epoxy resin, phenol resin, amide resin or imide resin can be used.

For obtaining a high heat resistance of the composite magnetic body 1, it is preferable to use thermoplastic resin having a glass transition temperature of not less than 120° C. For example, it is preferable to use at least one selected from thermoplastic polyimide and liquid crystal polymer.

As the soft magnetic powder 3, an Fe-Al-Si alloy (trademark: Sendust) or an Fe-Ni alloy (Permalloy) can be used. It is preferable that an aspect ratio of the powder is sufficiently large (approximately not less than 10:1).

On the other hand, as the heat conductive powder 4, alumina ($Al_2O_3$), aluminum nitride (AlN), cubic boron nitride (BN), beryllium oxide (BeO), insulating silicon carbide (SiC), a heat conductive reinforcement (capton) or the like can be used.

When the thermoplastic resin having the glass transition temperature of not less than 120° C. is used without use of the heat conductive powder, a composite magnetic body obtained is poor in thermal conductivity but excellent in heat resistance and thus can be directly provided to or disposed near a component with much heat generation for removal and absorption of undesired electromagnetic waves. Naturally, by stacking it with an electric conductor, reflection of the electromagnetic waves is also accomplished and the thermal conductivity is improved.

Figure 2:
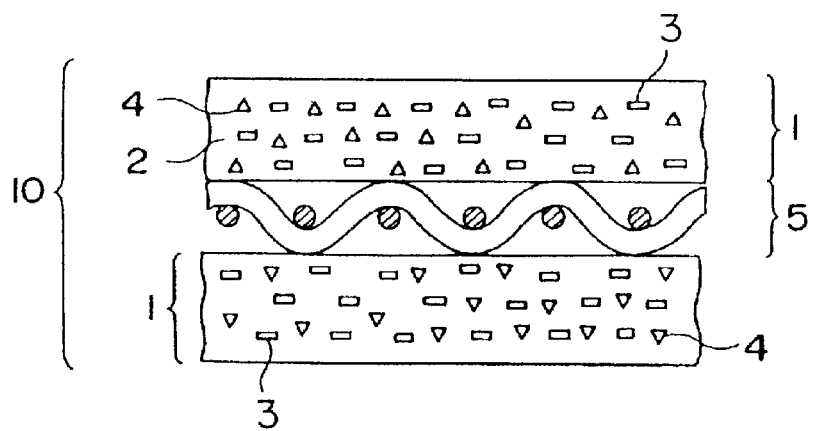
FIG. 2 is a schematic sectional view showing an electromagnetic interference suppressing body using the composite magnetic body of FIG. 1.

Referring to FIG. 2, an electromagnetic interference suppressing body 10 using the composite magnetic bodies 1 of FIG. 1 is shown. The electromagnetic interference suppressing body 10 has a stacked structure wherein the composite magnetic bodies 1 are stacked on both sides of an electrically conductive support 5. The electrically conductive support 5, although an example using one constituted of a textile of electrically conductive fiber is shown in the figure, may be constituted of an electric conductor thin plate, a electric conductor mesh plate, a soft magnetic metal plate, a soft magnetic metal mesh plate or a textile of soft magnetic metal fiber. It may also be arranged that a layer of the composite magnetic body 1 is provided on only one side of the electrically conductive support 5.

Since a structure itself of the electromagnetic interference suppressing body 10 and an electromagnetic interference suppressing operation thereof are disclosed in detail in JP-A-7-212079, explanation thereof is omitted with respect to the present invention.

Figure 3:
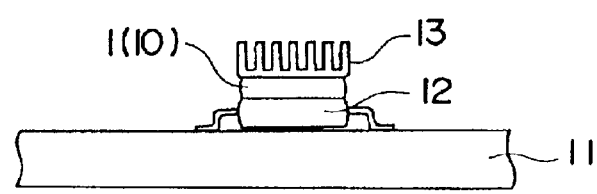
FIG. 3 is a side view of an electronic device, wherein the composite magnetic body shown in FIG. 1 is used as a heat dissipation sheet and attached to an IC package along with a heat sink.

Referring to FIG. 3, an IC package 12 is mounted on a circuit board 11 as an electronic component of active elements. For enhancing dissipation of generated heat of the IC package 12, a heat sink 13 is provided via the composite magnetic body 1. In this structure, the heat from the IC package 12 is conducted to the heat sink 8 through the composite magnetic body 1 excellent in thermal conductivity and radiated therefrom. As a result, heat dissipation of the IC package 12 is effectively carried out. Specifically, the composite magnetic body 1 is used as a heat dissipation sheet. Naturally, since electromagnetic waves from the exterior and the interior of the IC package 12 are absorbed by the composite magnetic body 1, an influence by the external electromagnetic waves or radiation of electromagnetic noise to the exterior can be prevented.

As a heat dissipation sheet, the electromagnetic interference suppressing body 10 of FIG. 2 can be used instead of the composite magnetic body 1. For indicating this, in FIG. 3, reference sign 10 representing the electromagnetic interference suppressing body is shown in parentheses along with reference sign 1 representing the composite magnetic body.

Figure 4:
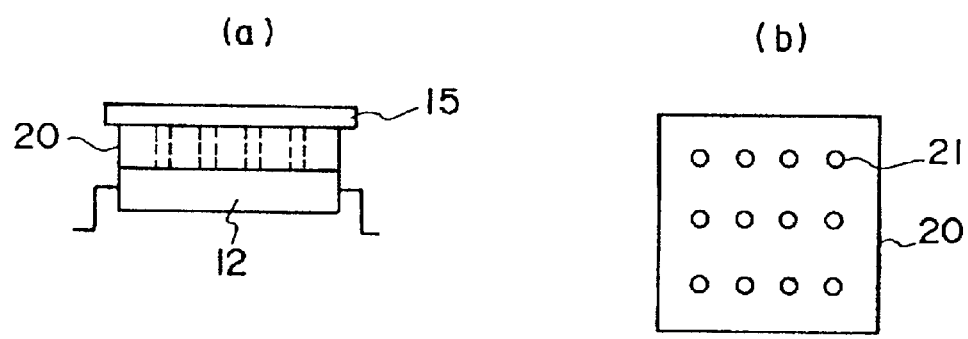
FIG. 4 shows an IC package attached with a heat dissipation sheet made of the composite magnetic body shown in FIG. 1, along with a heat sink, wherein (a) is a side view thereof and (b) is a plan view of the heat dissipation sheet.

FIG. 4 is a modification of FIG. 3. A heat dissipation sheet 20 made of the composite magnetic body 1 of FIG. 1 is formed with through-holes 21 as shown at 21 in (b) of the same figure. A plurality of pins 151 extending downward from a heat sink shown at 15 in (a) of the same figure pass through the through-holes 21. As the heat dissipation sheet, the electromagnetic interference suppressing body 10 of FIG. 2 can be used.

Figure 5:
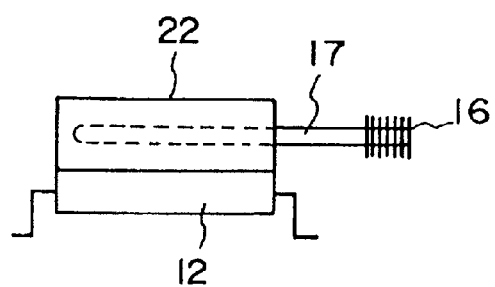
FIG. 5 is a side view showing an IC package attached with a heat dissipation sheet made of the composite magnetic body shown in FIG. 1, along with a radiator utilizing a heat pipe.

Referring to FIG. 5, there is shown a structure where a heat dissipation sheet or a block 22, on the IC package 12, made of the composite magnetic body 1 of FIG. 1 is formed with a hole into which a heat pipe 17 of a radiator 16 is inserted. In this structure, heat from the IC package is transmitted to the radiator 16 from the heat dissipation sheet 22 through the heat pipe 17 and radiated therefrom.

Figure 6:
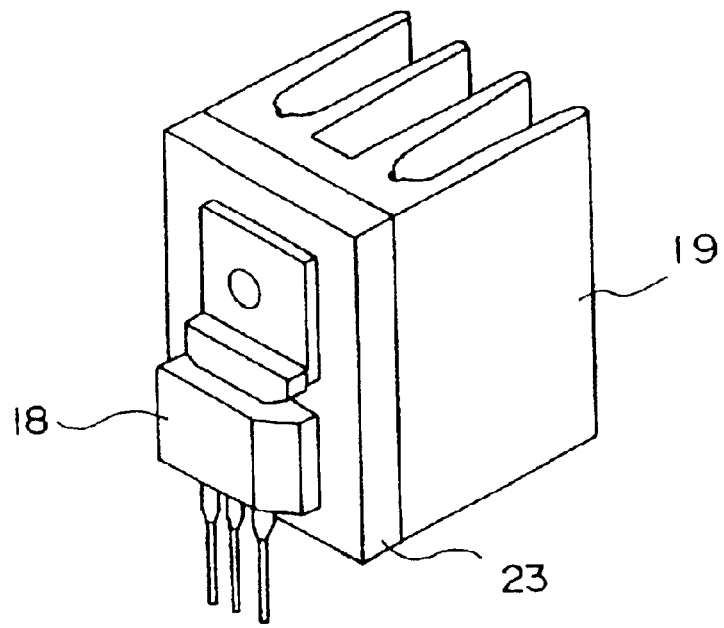
FIG. 6 is a perspective view showing a switching device attached with a heat dissipation sheet of the composite magnetic body shown in FIG. 1, along with a heat sink.

Referring to FIG. 6, there is shown an apparatus wherein a heat sink 19 with fins is attached to a switching element 18 via a heat dissipation sheet 23 made of the composite magnetic body 1 of FIG. 1.

Figure 7:
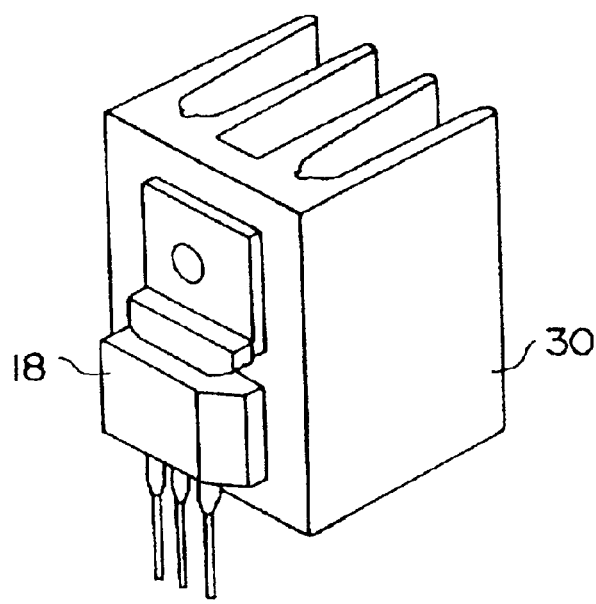
FIG. 7 is a perspective view showing a switching device attached with a heat sink made of the composite magnetic body shown in FIG. 1.

A heat sink itself can be constituted of the composite magnetic body 1. FIG. 7 shows this example. In the same figure, a heat sink 30 constituted of the composite magnetic body 1 is directly attached to the switching element 18.

Figure 8:
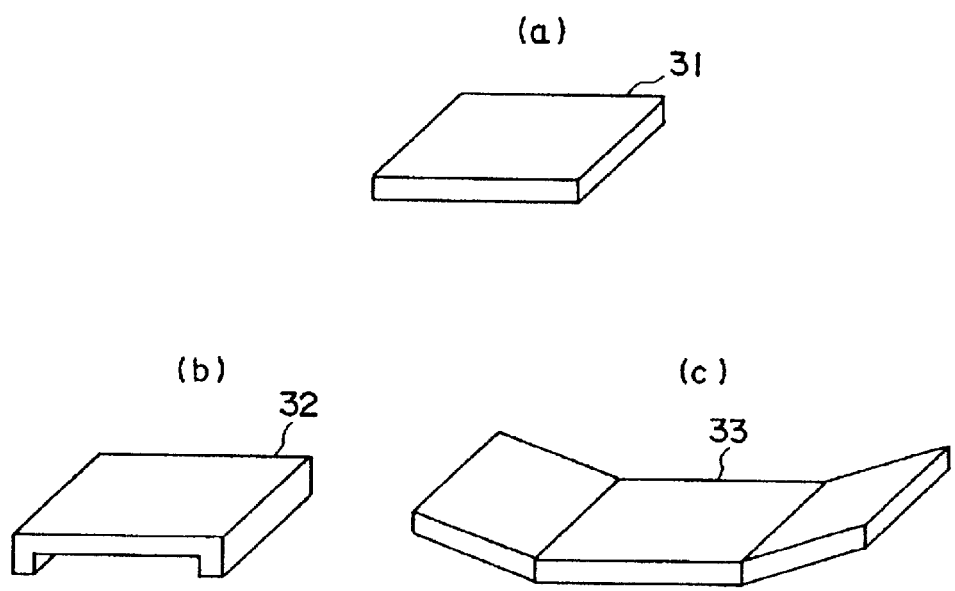
FIGS. 8(a), (b) and (c) are perspective views showing different structures of heat sinks using the composite magnetic body shown in FIG. 1, as heat sinks for IC packages.

FIG. 8 shows various shapes of heat sinks constituted of the composite magnetic body 1. In the figure, (a) shows a heat sink 31 having a simple plate shape, (b) shows a U-shaped heat sink 32 provided with flanges at both ends of a plate, and (c) shows a heat sink 33 having a dish shape. These heat sinks are not only constituted of the composite magnetic body 1, but may also be constituted using the electromagnetic interference body of FIG. 2.

Figure 9:
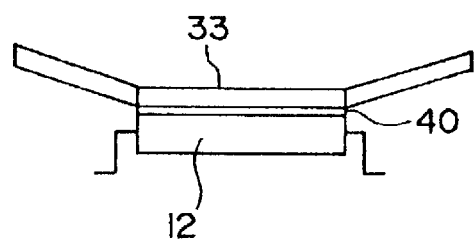
FIG. 9 is a side view of an IC package attached with the heat sink of FIG. 8(c).

FIG. 9 is a side view showing the state wherein the heat sink 33 of FIG. 8(c) is attached to the IC package 12 by an adhesive 40. Also in this structure, the generated heat of the IC package 12 can be effectively radiated, and the radiation and invasion of the undesired electromagnetic waves can be prohibited.

Figure 10:
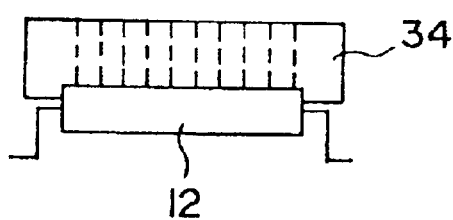
FIGS. 10(a) and (b) are a side view of an IC package attached with a heat sink of another type and a plan view of the heat sink, respectively.
Figure 10:
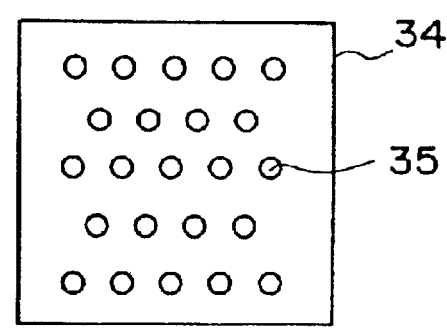

FIG. 10 is a diagram showing still another structure of a heat sink using the composite magnetic body 1 of FIG. 1 or the electromagnetic interference suppressing body 10 of FIG. 2. As shown in (b) of the same figure, the heat sink 34 has a structure such that it is U-shaped in section and provided with many through-holes 35 extending from the obverse side to the reverse side thereof. In this structure, the dissipation of generated heat from the IC package 12 is promoted by the through-holes 35.

Hereinbelow, characteristics will be cited about examples of a composite magnetic body according to the present invention and a stacked structure of the composite magnetic body and a conductor.

Figure 11:
FIG. 11 is sectional views showing samples used for evaluating an electric characteristic, an electromagnetic interference suppressing characteristic and a heat dissipation characteristic of a composite magnetic body of the present invention, wherein (a), (b) and (c) show a sample composed of the composite magnetic body only, a stacked sample of the composite magnetic body and an electric conductor, and a comparative sample not using the composite magnetic body, respectively.
Figure 11:
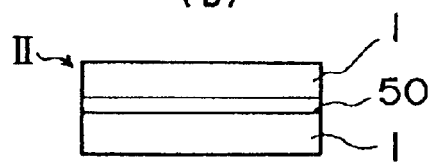
Figure 11:
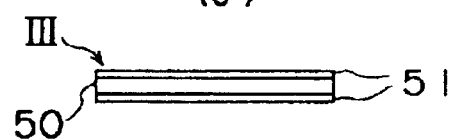

First, a plate sample I shown at (a) in FIG. 11 was prepared, which was made of a composite magnetic body comprising soft magnetic powder, an organic binding agent and heat conductive powder at a composite ratio shown in Table 1. The size was set to 3.8×10.2 (cm).

Specifically, soft magnetic powder, an organic binding agent and heat conductive powder subjected to the coupling process were, at first, kneaded by a kneader and rolled through rolls in parallel relationship onto the other so as to produce a composite magnetic sheet with a thickness of 0.5 mm. Then, two obtained sheets were stuck together to obtain the sample I with a thickness of 1 mm having a structure as shown at (a) in FIG. 11.

TABLE 1

| | Substance Name | Composite Ratio (Weight Parts) |
|---|---|---|
| Soft Magnetic Powder | Fe—Al—Si Alloy Mean Particle Diameter: 35 μm Aspect Ratio: > 5 | 80 |
| Coupling Agent | titanate | 0.8 |
| Organic Binding Agent | chlorinated polyethylene | 15 |
| Heat Conductive Powder | $Al_2O_3$ | 5 |

The obtained sample I was analyzed using a vibrating sample type magnetometer and a scanning electron microscope, and it was found that a magnetization easy axis and orientation of the magnetic particles are both in an in-surface direction of this layer.

The soft magnetic powder used herein was gas-phase oxidized in an atmosphere of $N_2$—$O_2$ mixed gas at a 20% $O_2$ partial pressure, subjected to annealing in an atmosphere of Ar at 650° C. for two hours, and formed with oxide films on the surfaces thereof.

The sheets 1 of the composite magnetic body obtained above and a copper thin plate 50 were stacked together to produce a sample II of a structure shown at (b) in FIG. 11. Specifically, the extremely thin copper plate with a thickness of 0.18 mm was sandwiched on both sides thereof by the sheets of the composite magnetic body 1 and stacked together, and then rolled by the rolls to obtain the total thickness of 1 mm.

Further, as a comparative example, a sample III of a structure of FIG. 11(c) was prepared. Specifically, sheets of insulator 51 made of polyvinyl fluoride were stacked on both sides of an extremely thin copper plate 50 with a thickness of 0.18 mm to obtain the total thickness of 0.3 mm.

Then, about the samples I to III, the surface resistivity, the transmittance attenuation, the coupling attenuation and the heat dissipation amount were evaluated.

Figure 12:
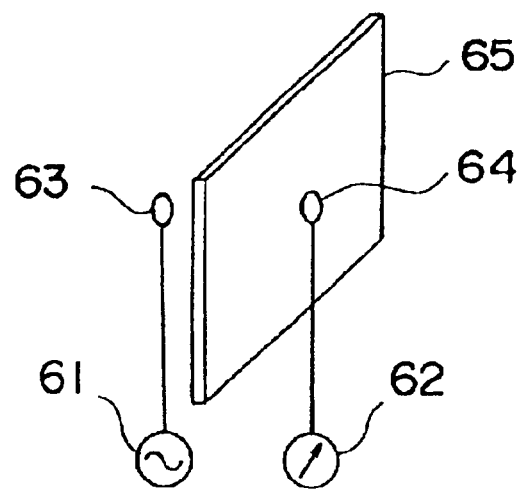
FIG. 12 is a schematic diagram showing an evaluation system for measuring a transmittance level of each sample of FIG. 11.
Figure 13:
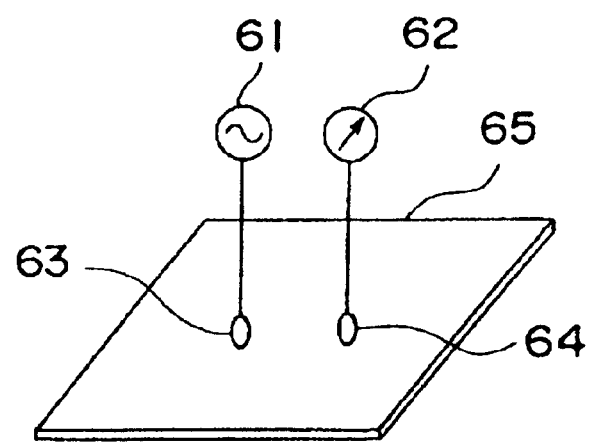
FIG. 13 is a schematic diagram of an evaluation system for measuring an electromagnetic coupling level of each sample of FIG. 11.

For measuring the transmittance attenuation and the coupling attenuation, an apparatus as shown in FIGS. 12 and 13 was used wherein an electromagnetic wave radiating micro-loop antenna 63 and an electromagnetic field receiving micro-loop antenna 64 were connected to an electromagnetic wave generator 61 and an electromagnetic field strength measuring device 62, respectively. As shown in FIG. 12, the transmittance attenuation was measured by disposing a sample 65 between the electromagnetic wave radiating micro-loop antenna 63 and the electromagnetic field receiving micro-loop antenna 64.

On the other hand, as shown in FIG. 13, the coupling attenuation was measured by confronting the electromagnetic wave transmitting micro-loop antenna 63 and the electromagnetic field receiving micro-loop antenna 64 against the same side of the sample 65.

To the electromagnetic field strength measuring device 62, a spectrum analyzer, not shown, was connected. The measurement was carried out at frequencies 100 to 1000 MHz, using as a reference an electromagnetic field strength in the state where the sample 65 was not present.

Using a silicon heat conductive adhesive tape (THERMATTACH produced by Taiyo Kanaami Co., Ltd.), the samples I to III were adhered to a semiconductor device. Using as a reference a state where no sample was present, the heat dissipation amount was expressed by a temperature difference (ΔT) relative to a sample temperature. The larger numeric value of the temperature difference represents the higher dissipation effect. The measurement condition was such that there was no air flow and the ambient temperature was 21 to 24° C.

The measurement results are shown in Table 2.

TABLE 2

| Sample | Thickness (mm) | Surface Resistivity (Ω) | Transmittance Attenuation (dB) | Coupling Attenuation (dB) | Temperature ΔT (° C.) |
|---|---|---|---|---|---|
| I | 1 | $1 \times 10^8$ | 6 to 12 | 8 to 10 | 20 |
| II | 1 | $1 \times 10^8$ | 40 to 55 | 2 to 3 | 45 |
| III | 0.3 | $1 \times 10^{14}$ | 40 to 55 | −8 to −10 | 24 |

From Table 2, it is seen that the composite magnetic body of the present invention and the one having the stacked structure of the composite magnetic body and the electric conductor (samples I and II) have characteristics more than equality as compared with the comparative sample (sample III). Further, in comparison between the samples I and II, it is seen that the sample I is excellent in coupling attenuation while the sample II is excellent in heat dissipation amount.

Industrial Applicability

According to the present invention, since there can be obtained a composite magnetic body excellent in thermal resistance and thermal conductivity and having electromagnetic wave absorbing capability, it may be used as a heat dissipation sheet and/or a heat sink for an electronic component or device so as to promote heat dissipation while prohibiting radiation and invasion of undesired electromagnetic waves.

What is claimed is:

1. An electronic device having attached thereto a stationary electromagnetic interference suppressing body for suppressing electromagnetic interference due to external and/or internal presence of electromagnetic waves, said stationary electromagnetic interference suppressing body being in the form of a sheet comprising an organic binding agent layer and a soft magnetic powder dispersed through said organic binding agent layer, wherein said stationary electromagnetic interference suppressing body further comprises a separate heat conductive but electrically insulative powder dispersed through said organic binding agent layer, for improving the thermal conductivity of said electromagnetic interference suppressing body during use thereof in association with said electronic device.

2. The electronic device of claim 1, wherein said heat conductive powder is at least one selected from the group consisting of alumina ($Al_2O_3$), aluminum nitride (AlN), cubic boron nitride (BN), beryllium oxide (BeO), and silicon carbide (SiC).

3. The electronic device of claim 2, wherein said organic binding agent is a thermoplastic resin having a glass transition temperature of not less than about 120° C.

4. The electronic device of claim 3, wherein said organic binding agent is at least one of thermoplastic polyamide and a liquid crystal polymer.

5. The electronic device of claim 4, wherein said electromagnetic interference suppressing body is in the form of a sheet, for use, in contact with components to control the temperature thereof during use of said electronic device.

6. A combination of an electronic device, susceptible to and/or generating electromagnetic waves, and having adjacent thereto an electromagnetic interference suppressing article, said article comprising:

a first composite magnetic body in the form of a sheet, comprising a first soft magnetic powder and a first heat conductive powder separately dispersed through a first organic binding agent; and an electrically conductive support in the form of a sheet, mounted on said first composite magnetic body.

7. The electronic device of claim 6, further comprising a second composite magnetic body in the form of a sheet, mounted on said electrically conductive support, comprising a second soft magnetic powder and a second heat conductive powder separately dispersed through a second organic binding agent.

8. The electronic device of claim 6 or 7, wherein said electrically conductive support is at least one selected from the group consisting of a textile of electrically conductive fiber, an electric conductor plate, an electric conductor mesh plate, a textile of soft magnetic metal fiber, a soft magnetic metal plate, and a soft magnetic metal mesh plate.

9. The electronic device of claim 6 or 7, further comprising a heat sink mounted on the electromagnetic interference suppressing article.

10. The electronic device of claim 6, further comprising electrical components, wherein said first composite magnetic body is mounted on said electrical components.

11. The electronic device of claim 10, wherein said electricl components are in the form of an integrated circuit.

12. The electronic device of claim 11, wherein said integrated circuit is mounted on a circuit board.

* * * * *